United States Patent
Martin

(10) Patent No.: US 6,577,041 B1
(45) Date of Patent: Jun. 10, 2003

(54) CONVERTER FOR SURFACE ACOUSTIC WAVES

(75) Inventor: Günter Martin, Dresden (DE)

(73) Assignee: Tele Filter Zweigniederlassung Der Dover Germany GmbH, Teltow (DE)

(*) Notice: Subject to any disclaimer, the term of this patent is extended or adjusted under 35 U.S.C. 154(b) by 0 days.

(21) Appl. No.: 09/980,342

(22) PCT Filed: May 30, 2000

(86) PCT No.: PCT/DE00/01807
§ 371 (c)(1),
(2), (4) Date: Nov. 30, 2001

(87) PCT Pub. No.: WO00/76064
PCT Pub. Date: Dec. 14, 2000

(30) Foreign Application Priority Data

Jun. 3, 1999 (DE) .......................... 199 25 800

(51) Int. Cl.⁷ .................. H03H 9/145; H02N 2/00; H01L 41/04; H01L 41/08; H01L 41/18
(52) U.S. Cl. ................ 310/313 B; 310/313 R; 310/313 C; 310/313 D
(58) Field of Search ................. 310/313 R, 313 B, 310/313 C, 313 D

(56) References Cited

U.S. PATENT DOCUMENTS

| | | | | |
|---|---|---|---|---|
| 4,066,985 A | * | 1/1978 | Kuny | 333/194 |
| 4,162,415 A | * | 7/1979 | Andreev et al. | 310/313 B |
| 4,166,257 A | * | 8/1979 | Subramanian | 333/151 |
| 4,250,474 A | | 2/1981 | Joseph | |
| 4,393,321 A | * | 7/1983 | Bagdasarian et al. | 310/313 B |
| 4,591,815 A | * | 5/1986 | Schofield | 333/195 |
| 4,635,008 A | * | 1/1987 | Solie | 333/195 |
| 4,659,955 A | * | 4/1987 | Schofield | 310/313 D |
| 4,746,882 A | * | 5/1988 | Solie | 333/196 |
| 4,908,542 A | * | 3/1990 | Solie | 310/313 B |
| 5,294,859 A | * | 3/1994 | Yamanouchi et al. | 310/313 B |

(List continued on next page.)

FOREIGN PATENT DOCUMENTS

| | | |
|---|---|---|
| DE | 208 512 | 5/1984 |
| DE | 197 24 259 | 12/1998 |
| FR | 2 398 411 | 2/1979 |
| WO | WO97/10646 | 3/1997 |

OTHER PUBLICATIONS

Yatsuda (1997) "Design Techniques for SAW Filters Using Slanted Finger Interdigital Transducers", IEEE Transactions on Ultrasonics, Ferroelectrics and Frequency Control, vol. 44, No. 2, pp. 453–459.

Primary Examiner—Nestor Ramirez
Assistant Examiner—J. Aguirrechea
(74) Attorney, Agent, or Firm—Collard & Roe, P.C.

(57) ABSTRACT

The aim of the invention is to modify prior art converters for surface acoustic waves in such a way that, despite an essentially homogeneous amplitude profile, other weighting factors can also be realized as 0 or ±1. The invention considers converters of the prior art that consist of prong groups which are comprised of at least two prongs, are arranged on a piezoelectric substrate, and which are assembled to form collector electrodes. According to the invention at least some of the prong groups are constructed in such a way that they differ from the remaining prong groups with regard to the wave amplitude excited thereby. In order to fulfil the aim of the invention, a combination of the following features is provided: a) the prongs form, in their entirety, a structure which tapers in a prong direction, and; b) at least some of the prong groups (21; 23; 31; 33), designated as structured prong groups, are subdivided, in a prong direction, into a number of subconverters (231; 232; 331; 332) and these subconverters are electrically connected in series. The invention can be used in components which function on the basis of surface acoustic waves, for example, in broadband band-pass filters and in delay lines.

19 Claims, 1 Drawing Sheet

U.S. PATENT DOCUMENTS

| | | | |
|---|---|---|---|
| 5,446,330 A | * 8/1995 | Eda et al. | 310/313 R |
| 5,477,098 A | * 12/1995 | Eguchi et al. | 310/313 R |
| 5,717,274 A | * 2/1998 | Eguchi et al. | 310/313 R |
| 5,831,492 A | * 11/1998 | Solie | 333/193 |
| 5,831,494 A | * 11/1998 | Solie | 333/193 |
| 5,959,388 A | * 9/1999 | Graebner et al. | 310/313 R |
| 6,023,122 A | * 2/2000 | Liu et al. | 310/313 B |
| 6,239,522 B1 | * 5/2001 | Glahn et al. | 310/63 |
| 6,413,439 B1 | * 7/2002 | Nishihara et al. | 216/77 |
| 6,426,583 B1 | * 7/2002 | Onishi et al. | 310/313 R |

* cited by examiner

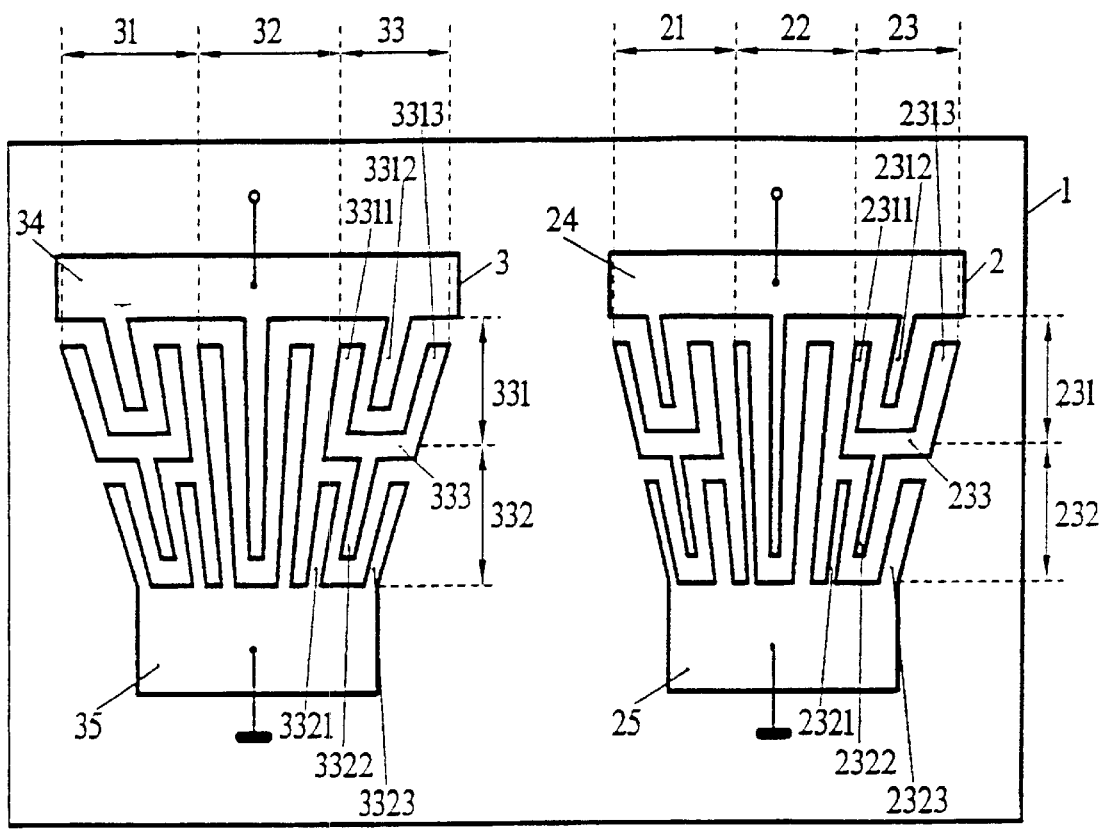

CONVERTER FOR SURFACE ACOUSTIC WAVES

CROSS REFERENCE TO RELATED APPLICATIONS

Applicant claims priority under 35 U.S.C. §119 of German Application No. 199 25 800.7 filed Jun. 3, 1999. Applicant also claims priority under 35 U.S.C. §365 of PCT/DE00/01807 filed May 30, 2000. The international application under PCT article 21(2) was not published in English.

TECHNICAL FIELD

The invention relates to the field of electrical engineering/electronics. Objects that can be applied and are useful are components based on surface acoustic waves such as employed, for example in wide-band band-pass filters and in delay lines.

STATE OF THE ART

Converters for surface acoustic waves are known which are composed of groups of prongs mounted on a piezoelectric substrate. Such groups of prongs each are comprised of at least two prongs, and at least some of the groups of prongs are structured in such a manner that they are different from the other groups of prongs with respect to the wave amplitude they excite.

In a special embodiment (WO 97/10646), interdigital converters designed with a tapering structure are composed of groups of prongs each comprised of three prongs. Two of said prongs form a pair of prongs having no reflection, whereas the third prong of each group is a reflector prong. The spacing between the center lines of the reflector prong and the prong of the pair of prongs located adjacent to said reflector prong typically amounts to 3 $p_{zg}/8$. In this connection, $p_{zg}$ represents the length of a group of prongs along a straight line extending parallel with the collector electrodes with a preset spacing from one of said collector electrodes. Each group of prongs consequently has a preferred direction with respect to the generated wave amplitude. A converter structure of this type is therefore referred to as single-phase unidirectional transducer, abbreviated as a SPUDT. If the width of the reflector prong amounts to $p_{zg}/4$ or $p_{zg}/8$, the groups of prongs are referred to as EWC- or DART-cells, respectively. As long as single-phase unidirectional transducers are not designed in the form of tapering structures, they are suited for filters with low insertion damping up to a band-width of about 1%. However, if single-phase unidirectional transducers are combined with the design principle of tapering structures, which is the case in reference [1] cited above, filters with low insertion damping can be realized even up to a bandwidth of up to at least 50%.

So as to be able to adjust the transmission behavior of the described filters in the desired manner, it is necessary to weigh the density of the wave amplitudes generated by the individual groups of prongs. The method of weighing the overlap, which is known from transversal filters, cannot be applied in the present case without serious drawbacks because the amplitudes have to be substantially continuous over the entire aperture of the participating transducers. In another special embodiment, which comes closest to the present invention, said problem has been solved by weighing the density of the gap (H. YATSUDA, IWEEE Transactions on Ultrasonics, Ferroelectrics and Frequency Control, vol. 41, March 1997, pages 453–459 [2]).

Another method for weighing the density of the wave amplitudes generated by groups of prongs in such a manner that such amplitudes are substantially continuous over the entire aperture of the participating transducers, is described in DD 208 512 [3]. The converters employed in said reference are transducers which, together with a transducer with a weighed overlap, form transversal filters, and consequently enhance due to their weighed density the selection of the blockage, as compared to the use of uniform transducers. The groups of prongs of said transducers are arranged parallel with each other and consequently do not form any tapering structure. Each group of prongs is composed of two equally wide prongs. The substantially homogeneous but nonetheless weighed density of the amplitude across the entire aperture is assured in that some of the groups of prongs are subdivided in two subconverters having the same aperture, and in that these subconverters are electrically connected in series. The weighed density factor of one of the structured groups of prongs described in [3] amounts to ½ of the value in relation to an unmodified group of prongs. This is a consequence of the fact that two identical subconverters of a group of prongs are connected in series, which causes the voltage applied to a structured group of prongs to amount to ½ of the amount of the converter voltage.

It is common practice to determine by suitable methods with the help of the filter specification continuous density functions and to subsequently convert such functions into a gap density. The solution [2] has the drawback that the weighed density of the gap, which only permits weighed density factors of equal to 0 or ±1 in some cases, is too rough for permitting a continuous density function to be reproduced with adequate accuracy. The filter so implemented may consequently deviate substantially from the requirements of the filter specification especially in the blocking area even though the application of the continuous, weighed density function, which is of only theoretical significance in the present case, would have assured that the specified requirements are satisfied.

REPRESENTATION OF THE INVENTION

The invention is based on the problem of altering converters for surface acoustic waves of the known type in a manner such that also weighed density factors of other than 0 or ±1 can be realized in spite of the substantially homogeneous profile of the amplitude.

Viewed as converters of the known type are those converters that are composed of groups of prongs mounted on a piezoelectric substrate, where each group of prongs is comprised of at least two prongs and collector electrodes, whereby the arrangement of prongs, in its entirety, is forming a structure tapering in the direction of one of the collector electrodes.

The problem is solved with the converter for surface acoustic waves specified in claim 20. The dependent claims specify variations of the embodiment of the invention.

For solving the problem, some of the groups of prongs, which are designated as structured groups of prongs, are subdivided in the direction of the prongs in a number of subconverters and electrically connected in series, which causes such structured groups of prongs to be different from the remaining groups of prongs with respect to the wave amplitude they excite.

This solution permits combining the advantages offered by tapering converter structures with the application of discontinuous density weighing methods that permit finer, stepped density factors than the weighed density gap. If a structured group of prongs is subdivided into an "N" number of identical subconverters connected in series, the density factor of such a group of prongs is equal to ±1/N. In addition to the density factors 0 and ±1 characteristic of the gap density, the following density factors are consequently adjustable: for example ±1/2 and ±1/3.

The density weighing method described above, which is combined with the tapered alignment of the converter prongs, has little significance for converters without a tapering alignment of the prongs because the weighed overlap density is available in that case, which is normally applied as well. As opposed to the above, the application of the weighed overlap density is not useful with a tapering alignment of the prongs because it would destroy the advantages they offer. Therefore, applicable are only those density weighing methods that modify the electrical voltage on the prongs. The described density weighing method is capable of effecting such a modification. Even though it has little significance for converters without the tapering alignment of the prongs, the claimed combination of features offers in a surprising way an enhanced solution to the density weighing problem in connection with converters with a tapering alignment of the prongs.

The invention can be usefully realized as follows:

According to a first useful embodiment, all subconverters have the same aperture.

Furthermore, it is useful if all groups of prongs each contain two or three prongs.

It is especially useful if two prongs in each group form a pair of prongs, whereby the prongs of a pair of prongs are equally wide and are connected to different collector electrodes, and if such prongs are arranged in relation to one another in such a way that the pair of prongs is without reflection overall, and the third prong in each group is a reflector prong. Special embodiments of such an arrangement comprise groups of prongs that are designed as EWC- or DART-cells.

It is especially useful if two prongs in each structured group form a pair of prongs, whereby the prongs of a pair of prongs are equally wide and are connected to different collector electrodes, and if such prongs are arranged in relation to one another in such a way that the pair of prongs is without reflection overall, and the third prong in each group is a reflector prong. Special embodiments of such an arrangement comprise groups of prongs that are designed as EWC- or DART-cells.

Furthermore, if every group of prongs is comprised of a pair of prongs and a reflector prong, the reflector prong and one of the prongs of the pair of prongs of the structured groups of prongs may be connected in each subconverter in an electrically conductive manner so as to form a subgroup of prongs.

Moreover, it is useful if each subgroup of prongs is connected in each case in an electrically conductive manner to the prong of the following subconverter of the same group of prongs not belonging to a subgroup of prongs. However, it is possible also that at least one subgroup of prongs is connected in an electrically conductive manner to the subgroup of prongs of the following subconverter of the same group of prongs.

The approximation of the density to the continuous function for weighing the density of the amplitude or reflection factor can be supported if the width of the prongs belonging to a pair of prongs, or the width of the reflector prong in at least one group of prongs is different from the width in the remaining groups of prongs.

It is useful if structured groups of prongs are present with a varying number of subconverters each having the same aperture. On the other hand, it is possible also that all structured groups of prongs are subdivided in the same number of subconverters each having the same aperture.

Such a subconverter, however, may contain at least two neighboring groups of prongs as well, each having the same number of subconverters with the same aperture. It is useful in such a case if the subgroups of prongs of the neighboring groups of prongs are. connected to each other in an electrically conductive manner.

Finally, it is highly useful if a converter as defined by the invention is the input and/or output converter of a surface acoustic wave filter.

The invention is explained in greater detail in the following with the help of an exemplified embodiment and an associated drawing.

SHORT DESCRIPTION OF THE DRAWINGS

The drawing shows a surface acoustic wave filter in which two converters for surface acoustic waves are arranged on a piezoelectric substrate.

BEST APPROACH FOR IMPLEMENTING THE INVENTION

In connection with the surface acoustic wave filter shown in the drawing, the two converters 2 and 3 for surface acoustic waves are mounted on a piezoelectric substrate 1. The converter 2 is comprised of the prong groups 21, 22 and 23, as well as the collector electrodes 24 and 25. All edges of the prongs are inclined against each other in such a manner that the entire arrangement of prongs is forming a structure tapering in the direction of the collector electrode 25. The prong groups 21, 22 and 23 are DART-cells. The prong groups 21 and 23 are identically structured apart from the different inclination of their prongs. Only the prong group 23 is therefore described in greater detail. Said prong group is subdivided in the subconverters 231 and 232 having the same aperture, The subconverters 231 and 232 each consist of the prongs 2311 and 2312, and 2321 and 2322, respectively, forming a pair of prongs, as well as of the reflector prong 2313 and, respectively, 2323. In accordance with the structure of a DART-cell, the prongs 2311 and 2312, and 2321 and 2322, respectively, forming a pair of prongs, have a width of $p_{zg}/8$ and a spacing of their center lines of $p_{zg}/4$, with pzg being the length of the prong group 22 along a straight line extending parallel with the collector electrodes 24 and 25 with a predetermined spacing from one of said collector electrodes. The reflector prongs 2313 and 2323 have a width of 3 $p_{zg}/8$. In the subconverter 231, the reflector prong 2313 and the prong 2311 are connected via the electrically conductive connection 233 to form a subgroup of prongs, whereby the connection 233 is at the same time a collector electrode of the subconverter 231. The electrically conductive connection of the prongs 2321 and 2323 of the subconverter 232 is established by the collector electrode 25. Thus the prong subgroup of the subconverter 231 comprised of the prongs 2311 and 2313 is connected in an electrically conductive manner to the prong 2322 of the following subconverter 232 of the same prong group 23 not belonging to the prong subgroup consisting of the prongs 2321 and 2323. The subconverters 231 and 232 are consequently connected in series. Between the prong 2312 and the prong subgroup formed by the prongs 2311 and 2313, as well as between the prong 2322 and the prong subgroup formed by the prongs 2321 and 2323, the amount of the applied voltage consequently amounts to half of the amount of the voltage applied between the collector electrodes 24 and 25, with the result that the wave amplitudes generated by the prong groups 21 and 23 have half the size of the amplitude generated by the prong group 22.

The converter 3 is comprised of the prong groups 31, 32 and 33, as well as of the collector electrodes 34 and 35. All edges of the prongs are inclined against each other in such a manner that the arrangement of prongs, in its entirety, is forming a structure tapering in the direction of the collector electrode 35. The prong groups 31 and 33 are structured identically apart from the varying inclination of their prongs. Only the prong group 33 is therefore described in greater detail. Said group of prongs is subdivided in the subconverters 331 and 332 having the same aperture. The subconverters 331 and 332 are comprised of the prongs 3311, 3312 and 3313, and, respectively, the prongs 3321, 3322 and 3323. All of said prongs as well as all of the gaps between said prongs have a width of $p_{zg}/6$. In this connection, $p_{zg}$ is the length of the prong group 32 along a straight line extending parallel with the collector electrodes 34 and 35 with a preset spacing from one of said collector electrodes. In the subconverter 331, the prongs 3313 and 3311 are connected to form a subgroup of prongs via the electrically conductive connection 333, whereby the connection 333 is at the same time a collector electrode of the subconverter 331. The electrically conductive connection of the prongs 3321 and 3323 of the subconverter 332 is made by the collector electrode 35. Thus the prong subgroup of the subconverter 331 comprised of the prongs 3311 and 3313 is connected in an electrically conductive manner to that prong 3322 of the following subconverter 332 of the same prong group 33 not belonging to the subgroup of prongs consisting of the prongs 3321 and 3323. The subconverters 331 and 332 are consequently electrically connected in series. Therefore, between the prong 3312 and the subgroup of prongs formed by the prongs 3311 and 3313, a well as between the prong 3322 and the subgroup of prongs formed by the prongs 3321 and 3323, the amount of the voltage applied comes to half the amount of the voltage applied between the collector electrodes 34 and 35, with the result that the wave amplitudes generated by the prong groups 31 and 33 are half the size of the wave amplitude generated by the prong group 32.

The converter 2 is operated as an input converter and the converter 3 as an output converter of the surface acoustic wave filter.

What is claimed is:

1. A converter for surface acoustic waves comprised of groups of prongs (2 to 23; 31 to 33) mounted on a piezoelectric substrate (1), said groups of prongs each containing at least two prongs, and collector electrodes (24; 25; 34; 35), whereby the arrangement of prongs, in its entirety is forming a structure tapering in the direction of one of the collector electrodes, characterized in that some of the groups of prongs (21; 23; 31; 33), which are designated as structured groups of prongs, are subdivided in the direction of the prongs in a number of subconverters (231; 232; 331; 332), and electrically connected in series, causing such groups to be different from the remaining groups of prongs with respect to the wave amplitude they excite.

2. The converter for surface acoustic waves according to claim 1, characterized in that all subconverters (231; 232; 331; 332) have the same aperture.

3. The converter for surface acoustic waves according to claim 1, characterized in that each group of prongs contains two prongs.

4. The converter for surface acoustic waves according to claim 1, characterized in that each group of prongs (21 to 23; 31 to 33) contains three prongs.

5. The converter for surface acoustic waves according to claim 4, characterized in that two prongs (2311+2312; 2321+2322; 3312+3313; 3322+3323) in each group of prongs (23; 33) form a pair of prongs, whereby the prongs of a pair of prongs are equally wide and are connected to different collector electrodes (24; 25; 34; 35), and are arranged in relation to each other in such a manner that the pair of prongs overall is without reflection; and that the third prong (2313; 2323; 3311; 3321) in each group is a reflector prong.

6. The converter for surface acoustic waves according to claim 5, characterized in that each group of prongs (21 to 23; 31 to 33) is a DART-cell.

7. The converter for surface acoustic waves according to claim 5, characterized in that each group of prongs (21 to 23; 31 to 33) is an EWC-cell.

8. The converter for surface acoustic waves according to claim 3, characterized in that in the structured groups of prongs, one prong of a subconverter is connected in each case in an electrically conductive manner to the other prong of the following subconverter.

9. The converter for surface acoustic waves according to claim 3, characterized in that in the structured groups of prongs, one prong of a subconverter is connected in each case in an electrically conductive manner to the same prong of the following subconverter.

10. The converter for surface acoustic waves according to claim 5, characterized in that in each subconverter (231; 232; 331; 332) of the structured prong groups (231; 232; 331; 332), the reflector prong (2313; 2323; 3311; 3321) and one prong (2311; 2321; 3313; 3323) of the pair of prongs are connected in an electrically conductive manner to form a subgroup of prongs.

11. The converter for surface acoustic waves according to claim 10, characterized in that each prong subgroup (2311+2313; 3311+3313) is connected in an electrically conductive manner to that prong (2322; 3322) of the following subconverter (232; 332) of the same group of prongs (23; 33) not belonging to a subgroup of prongs.

12. The converter for surface acoustic waves according to claim 10, characterized in that at least one subgroup of prongs is connected in an electrically conductive manner to the subgroup of prongs of the following subconverter of the same group of prongs.

13. The converter for surface acoustic waves according to claim 5, characterized in that the widths of the prongs (2311; 2312; 2321; 2322; 3312; 3313; 3322; 3323) belonging to the respective pair of prongs in at least one group of prongs (21 to 23; 31 to 33) are different from the widths in the remaining groups of prongs.

14. The converter for surface acoustic waves according to claim 5, characterized in that the width of the reflector prong (2313; 2323; 3311; 3321) in at least one prong group (21 to 23; 31 to 33) is different from the one in the remaining groups of prongs.

15. The converter for surface acoustic waves according to claim 2, characterized in that structured groups of prongs (21; 23; 31; 33) with a varying number of subconverters (231; 232; 331; 332) each having the same aperture are present.

16. The converter for surface acoustic waves according to claim 2, characterized in that all structured groups of prongs (21; 23; 31; 33) are subdivided in the same number of subconverters (231; 232; 331; 332) each having the same aperture.

17. The converter for surface acoustic waves according to claim 2, characterized in that said converter contains at least two adjacent groups of prongs each having the same number of subconverters with the same aperture.

18. The converter for surface acoustic waves according to claim 10, characterized in that the subgroups of prongs of the neighboring groups of prongs are connected to each other in an electrically conductive manner.

19. Application of a converter for surface acoustic waves according to claim 1 as an input and/or output converter of a surface acoustic wave filter.

* * * * *